US012693232B2

(12) United States Patent
Gondaira et al.

(10) Patent No.: US 12,693,232 B2
(45) Date of Patent: Jul. 28, 2026

(54) LIGHT SOURCE APPARATUS, INSPECTION APPARATUS, EXPOSURE APPARATUS, LIGHT SOURCE CONTROL METHOD, INSPECTION METHOD, AND EXPOSURE METHOD

(71) Applicant: Lasertec Corporation, Yokohama (JP)

(72) Inventors: Ko Gondaira, Yokohama (JP); Kosei Ishibashi, Yokohama (JP); Hirokazu Seki, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 134 days.

(21) Appl. No.: 18/894,410

(22) Filed: Sep. 24, 2024

(65) Prior Publication Data

US 2025/0102445 A1 Mar. 27, 2025

(30) Foreign Application Priority Data

Sep. 25, 2023 (JP) ................................. 2023-160001

(51) Int. Cl.
*G01N 21/88* (2006.01)
*G01N 21/956* (2006.01)
*G03F 1/84* (2012.01)

(52) U.S. Cl.
CPC ....... *G01N 21/8806* (2013.01); *G01N 21/956* (2013.01); *G03F 1/84* (2013.01); *G01N 2021/8835* (2013.01); *G01N 2021/95676* (2013.01); *G01N 2201/021* (2013.01); *G01N 2201/025* (2013.01); *G01N 2201/068* (2013.01)

(58) Field of Classification Search
CPC ............. G01N 21/8806; G01N 21/956; G01N 2021/8835; G01N 2021/95676; G01N 2201/021; G01N 2201/025; G01N 2201/068; G03F 1/84
See application file for complete search history.

(56) References Cited

U.S. PATENT DOCUMENTS 9,544,984 B2 * 1/2017 Bykanov .............. H05G 2/0084
2002/0141537 A1 * 10/2002 Mochizuki ............... G21B 1/23
378/119
2015/0076359 A1 3/2015 Bykanov et al.

FOREIGN PATENT DOCUMENTS

JP 2020-077007 A 5/2020
JP 2022-168463 A 11/2022
WO WO 2015/013185 A1 1/2015

* cited by examiner

*Primary Examiner* — Kevin K Pyo
(74) *Attorney, Agent, or Firm* — ALSTON & BIRD LLP

(57) ABSTRACT

A light source apparatus according to the present disclosure includes an input optical system including a first optical member configured to irradiate a target material with excitation light, an output optical system including a second optical member configured to extract light generated by irradiating the target material with the excitation light, a target holding unit configured to hold the target material, an acquiring unit configured to acquire displacement of a surface position of the target material, a driving unit configured to cause relative positions of an optical member and the target holding unit to vary, the optical member including at least one of the first optical member and the second optical member, and a control unit configured to drive the driving unit based on the displacement.

25 Claims, 6 Drawing Sheets

START

S11

HOLD TARGET MATERIAL WITH TARGET HOLDING UNIT

S12

ACQUIRE DISPLACEMENT OF SURFACE POSITION OF TARGET MATERIAL

S13

CAUSE RELATIVE POSITIONS OF OPTICAL MEMBER AND
TARGET HOLDING UNIT TO VARY BASED ON DISPLACEMENT

S14

USE FIRST OPTICAL MEMBER
TO IRRADIATE TARGET MATERIAL WITH EXCITATION LIGHT

S15

EXTRACT GENERATED LIGHT WITH SECOND OPTICAL MEMBER

END

LIGHT SOURCE APPARATUS, INSPECTION APPARATUS, EXPOSURE APPARATUS, LIGHT SOURCE CONTROL METHOD, INSPECTION METHOD, AND EXPOSURE METHOD

INCORPORATION BY REFERENCE

This application is based upon and claims the benefit of priority from Japanese patent application No. 2023-160001, filed on Sep. 25, 2023, the disclosure of which is incorporated herein in its entirety by reference.

BACKGROUND

The present disclosure relates to a light source apparatus, an inspection apparatus, an exposure apparatus, a light source control method, an inspection method, and an exposure method.

Japanese Unexamined Patent Application Publication No. 2020-077007 describes a light source in which a target material is formed on the surface of a cylindrical member rotating around a rotation axis and the formed target material is irradiated with excitation light to emit illumination light.

Japanese Unexamined Patent Application Publication No. 2022-168463 describes a light source in which a target material, which is molten metal, is held with a centrifugal force on an inner wall of a crucible rotating around a rotation axis and the held target material is irradiated with excitation light to emit illumination light.

SUMMARY

In a light source apparatus, relative positions of a light emitting point located near a target material surface and an optical member may fluctuate because of vibration caused when a target holding unit such as a cylindrical member or a melting pot rotates, deformation of a structure itself, deformation due to rotational stress and heat of the target holding unit itself, consumption of the target material, supplement of the target material into the target holding unit, and the like. Accordingly, there may be a case in which light cannot be stably extracted from the light source apparatus.

An object of the present disclosure, which has been made in order to solve such a problem, is to provide a light source apparatus, an inspection apparatus, an exposure apparatus, a light source control method, an inspection method, and an exposure method that can improve stability of light extracted from the light source apparatus.

A light source apparatus according to the present disclosure includes: an input optical system including a first optical member configured to irradiate a target material with excitation light; an output optical system including a second optical member configured to extract light generated by irradiating the target material with the excitation light; a target holding unit configured to hold the target material; an acquiring unit configured to acquire displacement of a surface position of the target material; a driving unit configured to cause relative positions of an optical member and the target holding unit to vary, the optical member including at least one of the first optical member and the second optical member; and a control unit configured to drive the driving unit based on the displacement.

In the light source apparatus, the acquiring unit may acquire a displacement amount of the surface position, and the control unit may drive the driving unit with a control amount based on the displacement amount.

In the light source apparatus, the control unit may drive the driving unit such that relative positions of the optical member and a surface position of the target material held by the target holding unit are substantially fixed before and after the displacement.

In the light source apparatus, the acquiring unit may acquire the displacement from a reference position of the surface position of the target material, the control unit may drive the driving unit such that relative positions of the optical member at a time of the displacement of the surface position of the target material and the surface position of the target material held by the target holding unit are substantially the same as relative positions of the optical member at a time when the surface position of the target material is present in the reference position and the surface position of the target material held by the target holding unit.

In the light source apparatus, when the displacement of the surface position exceeding a predetermined threshold is acquired by the acquiring unit, the control unit may drive the driving unit such that the relative positions of the optical member and the target holding unit vary.

In the light source apparatus, when the displacement of the surface position exceeding the predetermined threshold in a direction of approaching the optical member is acquired by the acquiring unit, the control unit may drive the driving unit such that the relative positions of the optical member and the target holding unit vary.

In the light source apparatus, the target holding unit may move the target material to an irradiation position irradiated with the excitation light according to the movement of the target holding unit.

In the light source apparatus, the target holding unit may rotate around a rotation axis, the target material may move to the irradiation position according to a rotational movement around the rotation axis of the target holding unit, and the control unit may drive the driving unit such that the relative positions of the optical member and the target holding unit vary in a direction including a component of a direction orthogonal to the rotation axis.

In the light source apparatus, the control unit may drive the driving unit such that the relative positions of the optical member and the target holding unit vary in a direction including a component of a direction parallel to an optical axis of irradiation of the target material with the excitation light.

In the light source apparatus, rotating speed of the rotation around the rotation axis of the target holding unit may be substantially fixed before and after the relative positions vary.

The target holding unit may rotate around a rotation axis, the target material may move to the irradiation position according to rotational movement around the rotation axis of the target holding unit, and the control unit may drive the driving unit such that relative positions of the optical member and the target holding unit vary in a direction including a component of a direction parallel to the rotation axis.

In the light source apparatus, the target material may include molten metal, and the target holding unit may include a container, which holds the target material on an inside, and may hold the target material on an inner wall surface of the container with a centrifugal force.

The light source apparatus may further include a position sensor configured to acquire the surface position of the target material based on a distance to a liquid surface of the molten metal, and the acquiring unit may acquire the displacement of the surface position from the surface position acquired by the position sensor.

In the light source apparatus, the acquiring unit may predict the displacement of the surface position in the irradiation position from the displacement of the surface position in a position on a near side of the irradiation position with respect to a direction of the movement of the target holding unit to thereby acquire the displacement of the surface position in the irradiation position, and the control unit may control the driving unit based on the predicted displacement of the surface position.

In the light source apparatus, when the surface position is displaced at a predetermined period, the control unit may control the driving unit based on the period.

In the light source apparatus, the control unit may cause, by the driving unit, a position of the target holding unit to vary such that the relative positions of the optical member and the target holding unit vary.

The light source apparatus may further include a stage on which the target holding unit and the optical member are placed, and, when causing the relative positions of the target holding unit and the optical member to vary, the control unit may cause, by the driving unit, a position of the stage to vary and allow the driving unit to cause a position of the optical member to vary.

In the light source apparatus, the second optical member may include a collector mirror configured to reflect the generated light.

In the light source apparatus, the first optical member may include a condensing lens configured to condense the excitation light.

In the light source apparatus, the light may include EUV light.

An inspection apparatus according to the present disclosure includes: the light source apparatus explained above; and an inspection optical system configured to inspect an inspection target with the light extracted from the output optical system.

An exposure apparatus according to the present disclosure includes: the light source apparatus explained above; and an exposure optical system configured to expose an exposure target with the light extracted from the output optical system.

A light source control method according to the present disclosure includes: a step of holding a target material with a target holding unit; a step of acquiring displacement of a surface position of the target material with an acquiring unit; a step of causing, by the driving unit, relative positions of an optical member and the target holding unit to vary, based on the displacement, the optical member including at least one of a first optical member and a second optical member; a step of using an input optical system including the first optical member to irradiate the target material with excitation light; and a step of extracting, with an output optical system including the second optical member, light generated by irradiating the target material with the excitation light.

An inspection method according to the present disclosure includes a step of inspecting an inspection target with the light extracted by the light source control method explained above.

An exposure method according to the present disclosure includes a step of exposing an exposure target with the light extracted by the light source control method explained above.

According to the present disclosure, it is possible to provide a light source apparatus, an inspection apparatus, an exposure apparatus, a light source control method, an inspection method, and an exposure method that improve stability of light extracted from the light source apparatus.

The above and other objects, features and advantages of the present disclosure will become more fully understood from the detailed description given hereinbelow and the accompanying drawings.

DESCRIPTION OF EMBODIMENTS

Figure 1:
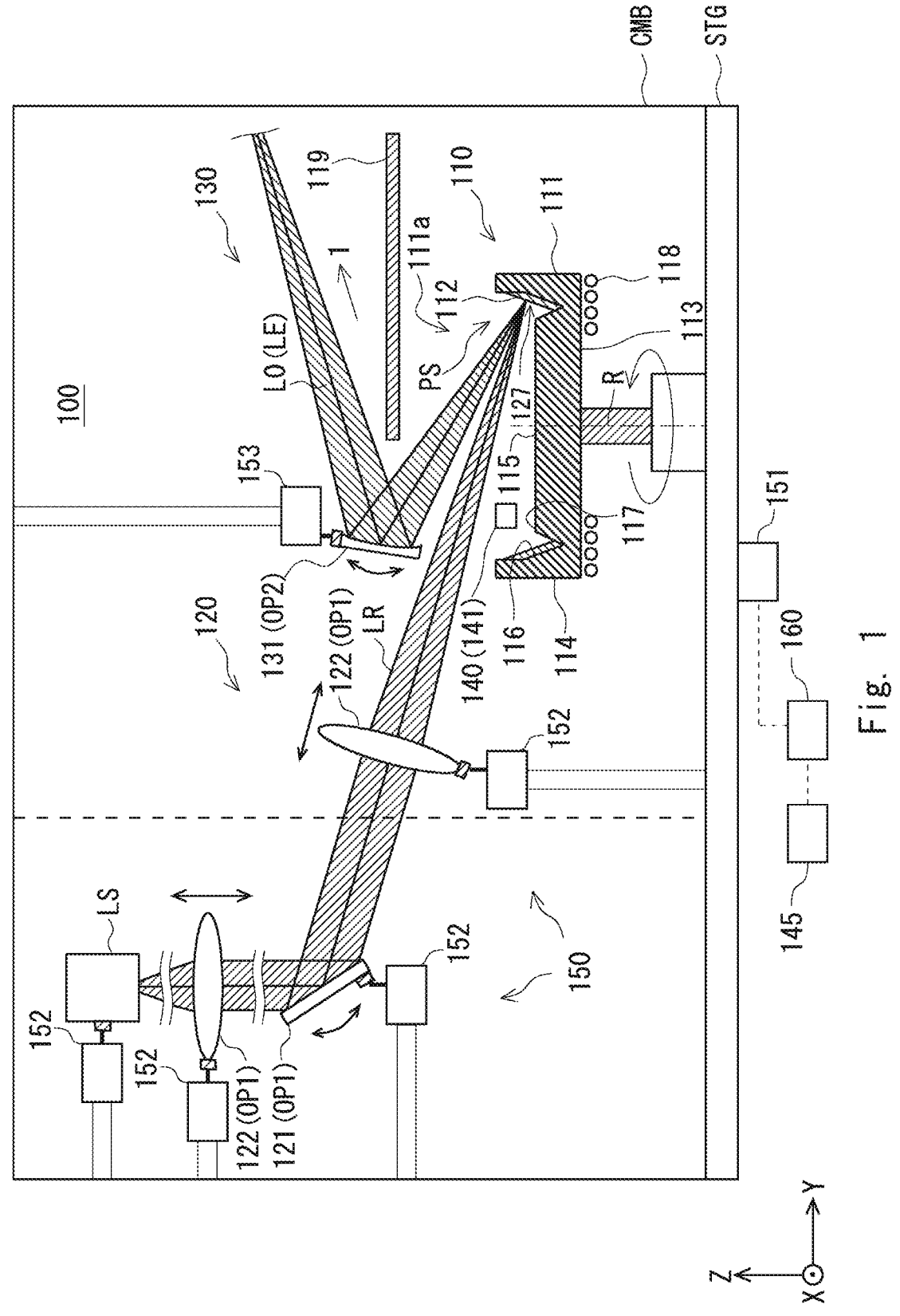
FIG. 1 is a sectional view illustrating a light source apparatus according to a first embodiment.

A specific configuration of an embodiment is explained below with reference to the drawings. The following explanation indicates a preferred embodiment of the present disclosure. The scope of the present disclosure is not limited to the embodiment explained below. In the following explanation, those with the same reference numerals and signs indicate substantially the same content.

First Embodiment

A light source apparatus according to a first embodiment is explained. The light source apparatus in the present embodiment generates light such as illumination light and exposure light used for an optical apparatus such as an inspection apparatus and an exposure apparatus. The light source apparatus may be provided integrally with the optical apparatus or may be disposed near the optical apparatus as a separate body separated from the optical apparatus. When the optical apparatus is the inspection apparatus, the light source apparatus generates illumination light for illuminating an inspection target in the inspection apparatus. When the optical apparatus is the exposure apparatus, the light source apparatus generates exposure light for exposing an exposure target in the exposure apparatus.

The light source apparatus generates light such as illumination light and exposure light by irradiating a target material held by a target holding unit with excitation light. In the following explanation, as an example of the light source apparatus, a light source apparatus that sets molten metal held by a container as the target material is explained. Note that the light source apparatus is not limited to the light source apparatus that sets the molten metal held by the container as the target material and may be a light source apparatus that sets droplet-like liquid metal, solid material fixed to a cylindrical drum, or the like as the target material.

Figure 2:
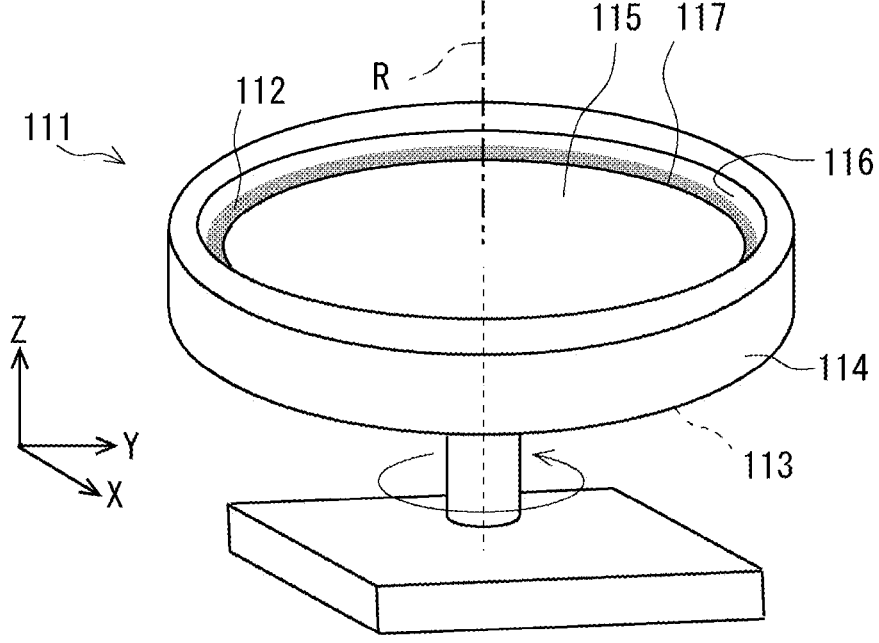
FIG. 2 is a perspective view illustrating a container functioning as a target holding unit in the light source apparatus according to the first embodiment.
Figure 3:
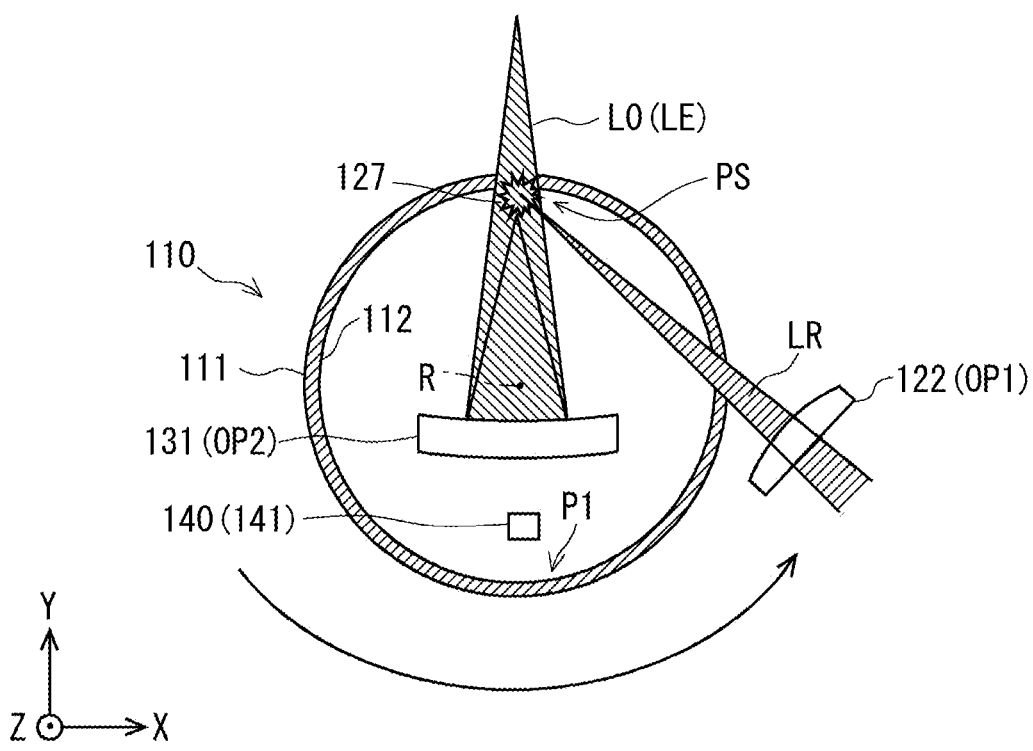
FIG. 3 is a plan view illustrating the light source apparatus according to the first embodiment.
Figure 4:
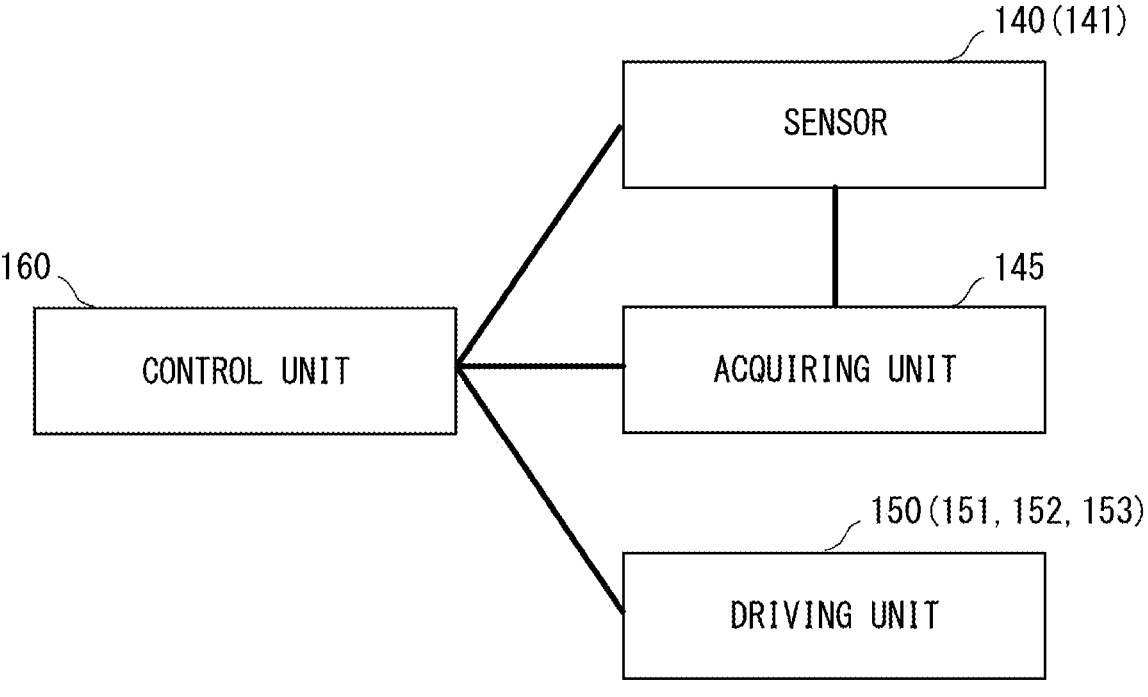
FIG. 4 is a block diagram illustrating a sensor, an acquiring unit, a driving unit, and a control unit in the light source apparatus according to the first embodiment.

FIG. 1 is a sectional view illustrating a light source apparatus 100 according to the first embodiment. FIG. 2 is a perspective view illustrating a container 111 functioning as a target holding unit 110 in the light source apparatus 100 according to the first embodiment. FIG. 3 is a plan view illustrating the light source apparatus 100 according to the first embodiment. FIG. 4 is a block diagram illustrating a sensor 140, an acquiring unit 145, a driving unit 150, and a control unit 160 in the light source apparatus 100 according to the first embodiment.

As illustrated in FIGS. 1 to 4, the light source apparatus 100 includes a stage STG, a target holding unit 110, an input optical system 120, an output optical system 130, a sensor 140, an acquiring unit 145, a driving unit 150, and a control unit 160. The sensor 140 may include a position sensor 141. The driving unit 150 may include driving units 151 to 153. In FIG. 1, the acquiring unit 145 and the control unit 160 are connected to only several members to prevent the figure from becoming complicated. However, the acquiring unit 145 and the control unit 160 may be connected to other members. In FIG. 3, several members are omitted.

At least parts of the target holding unit 110, the input optical system 120, the output optical system 130, and the sensor 140 and at least a part of the driving unit 150 in the light source apparatus 100 are placed on the stage STG. The acquiring unit 145 and the control unit 160 may be placed on the stage STG. The stage STG may include, for example, a stone surface plate. Here, for convenience of explanation of the light source apparatus 100, an XYZ orthogonal coordinate axis system having the vertical direction as a Z-axis direction is introduced. Note that the introduced XYZ orthogonal coordinate axis system is for convenience of explanation and does not limit the directions of the members. The stage STG is movable in an X-axis direction, a Y-axis direction, and the Z-axis direction. For example, the stage STG may rotate with axes such as an X axis, a Y axis, and a Z axis as rotation axes. The stage STG is driven to move and rotationally move by the driving unit 151.

The target holding unit 110 is placed on the stage STG. Thus, the target holding unit 110 moves together with the movement of the stage STG. The target holding unit 110 holds a target material 112. The target holding unit 110 is a container 111 such as a crucible. The container 111 can melt metal on the inside. The container 111 holds the target material 112 such as molten metal that generates plasma 127 with irradiation of excitation light LR. The excitation light LR is, for example, laser light including IR (Infrared) light.

Note that the target holding unit 110 is not limited to the container 111 and may be a cylindrical drum. In that case, the target holding unit 110 holds the target material 112 by fixing solid material, which becomes the target material 112, such as xenon (Xe) frozen on the surface of the drum.

The target material 112 may include molten metal. Note that the target material 112 is not limited to the molten metal held by the container 111 and may be solid metal, droplets, or the like if the target material 112 is a substance that generates the plasma 127 with irradiation of the excitation light LR. The molten metal is, for example, melted tin (Sn) or lithium (Li) but is not limited to tin and lithium if the molten metal generates the plasma 127 with irradiation of the excitation light LR.

The container 111 has a rotation axis R and rotates around the rotation axis R centering on the rotation axis R. The container 111 has, for example, a cylindrical shape with one opening closed. A closed portion of the container 111 is referred to as bottom 113. A cylindrical portion of the container 111 is referred to as cylindrical section 114. The surface on the inner side of the bottom 113 is referred to as bottom surface 115. The surface on the inner side of the cylindrical section 114 is referred to as inner wall surface 116. A groove 117 may be formed in a joining portion of the bottom 113 and the cylindrical section 114. Note that the container 111 may include a shape other than the above if the container 111 can hold the molten metal.

The target holding unit 110 holds the target material 112 on the inner wall surface 116 of the container 111 with a centrifugal force. The inner wall surface 116 formed to surround the rotation axis R may include a portion having a distance to the rotation axis R constant from the upper end to the lower end or may have a barrel shape swelled in the intermediate portion between the upper end and the lower end. The inner wall surface 116 may include a cone-shaped (or mortar-shaped) portion further expanded to the outer side upward. For example, the cone-shaped portion of the inner wall surface 116 may be connected to the groove 117.

The light source apparatus 100 may include a heater 118 and a debris shield 119 besides the target holding unit 110. The target material 112 such as molten metal can be formed in the container 111 by heating of the heater 118. The debris shield 119 is disposed in an opening 111*a* of the container 111 to cover the target material 112.

The target material 112 also rotates around the rotation axis R according to the rotation of the container 111 around the rotation axis R. As illustrated in FIG. 3, for example, the target material 112 located, at time t1, in a position P1 facing the position sensor 141 moves to an irradiation position PS at time t2 according to the rotational movement of the container 111. In this way, according to the movement (that is, the rotational movement) of the target holding unit 110, the target holding unit 110 moves the target material 112 to the irradiation position PS where the target material 112 is irradiated with the excitation light LR.

The input optical system 120 includes a first optical member OP1. The first optical member OP1 irradiates the target material 112 with the excitation light LR. The first optical member OP1 includes, for example, at least one of a mirror 121 and a condensing lens 122. Note that, if the first optical member OP1 is an optical member that irradiates the target material 112 with the excitation light LR, the first optical member OP1 is not limited to the mirror 121 and the condensing lens 122 and may be any types of optical element including a laser LS that generates the excitation light LR.

The first optical member OP1 in the input optical system 120 is placed on the stage STG. The first optical member OP1 may be fixed to a chamber CMB placed on the stage STG. In both the cases, the first optical member OP1 moves according to the movement of the stage STG. Note that the first optical member OP1 is connected to the driving unit 152 and is driven to move or rotate by the driving unit 152. Therefore, the first optical member OP1 may be driven to move by the driving unit 152 after moving according to the movement of the stage STG, before moving, or simultaneously with the movement.

The first optical member OP1 irradiates the target material 112 with the excitation light LR at an angle tilted from an axis perpendicular to the surface of the target material 112. Specifically, for example, the first optical member OP1 irradiates, at a tilted incident angle, the surface of the irradiation position PS with the excitation light LR. By irradiating the surface of the irradiation position PS with the excitation light LR at the tilted angle in this way, it is possible to suppress the influence of debris on the optical member including the collector mirror 131. A reason why the influence of debris on the optical member such as a collector mirror 131 can be suppressed is explained below.

When the surface of the target material 112 is irradiated with the excitation light LR from a direction orthogonal to the surface of the target material 112, the debris scatters in all directions centering on the direction orthogonal to the surface. Then, the debris is likely to adhere to the collector mirror 131 facing the irradiation position PS. On the other hand, when the surface of the irradiation position PS is irradiated with the excitation light LR at the tilted angle, the debris can be scattered in a reflection direction on the side opposite to an incident direction of the excitation light LR. Accordingly, it is possible to suppress the adhesion of the debris to the collector mirror 131. Further, when the surface of the irradiation position PS is irradiated with the excitation light LR at an incident angle tilted to the near side of the irradiation position PS with respect to a direction of the movement of the target holding unit 110, angular velocity in a rotating direction of the container 111 is added in a direction in which the debris scatters. Therefore, it is possible to further scatter the debris in the reflection direction of the excitation light LR. In this way, it is possible to suppress the influence of the debris on the optical members such as the collector mirror 131.

The mirror 121 reflects the excitation light LR generated by the laser LS to the irradiation position PS of the target material 112. The mirror 121 may include a mirror such as a piezo steering mirror. Note that, the mirror 121 is not limited to the piezo steering mirror and may include a Galvano mirror, a polygon mirror, and the like if the mirror 121 can reflect the excitation light LR to the target material 112. The condensing lens 122 condenses the excitation light LR on the irradiation position PS of the target material 112.

The light source apparatus 100 may include the laser LS that generates the excitation light LR. On the other hand, the light source apparatus 100 may introduce, into the light source apparatus 100, the excitation light LR from the laser LS installed separately from the light source apparatus 100 on the outside of the light source apparatus 100. When the laser LS is a part of the light source apparatus 100, the laser LS may be placed on the stage STG. The laser LS may be fixed to the chamber CMB placed on the stage STG. In both the cases, the laser LS may move according to the movement of the stage STG. Note that the laser LS may be connected to the driving unit 152 and driven to move and rotate by the driving unit 152. Therefore, the laser LS may be driven to move by the driving unit 152 after moving according to the movement of the stage STG, before moving, or simultaneously with the movement.

The laser LS emits, for example, the excitation light LR including IR light. The excitation light LR may irradiate the target material 112 according to oscillation and stop of control of the control unit 160. For example, the excitation light LR is reflected by the mirror 121 and condensed by the condensing lens 122. Accordingly, the excitation light LR irradiates the target material 112.

The output optical system 130 includes a second optical member OP2. The second optical member OP2 extracts, from the light source apparatus 100, light L0 generated by irradiating the target material 112 with the excitation light LR. The second optical member OP2 includes, for example, the collector mirror 131. Note that, if the second optical member OP2 is an optical member that extracts the light L0 generated by irradiating the target material 112 with the excitation light LR, the second optical member OP2 is not limited to the collector mirror 131 and may be any types of optical element including a second collector mirror (not illustrated) that further reflects the light L0 reflected by the collector mirror 131.

The second optical member OP2 in the output optical system 130 is placed on the stage STG. The second optical member OP2 may be fixed to the chamber CMB placed on the stage STG. In both the cases, the second optical member OP2 moves according to the movement of the stage STG. Note that the second optical member OP2 is connected to the driving unit 153 and driven to move and rotate by the driving unit 153. Therefore, the second optical member OP2 may be driven to move by the driving unit 153 after moving according to the movement of the stage STG, before moving, or simultaneously with the movement.

The collector mirror 131 reflects the light L0 generated from the target material 112 by the irradiation of the excitation light LR. The collector mirror 131 reflects, for example, EUV light LE generated by the irradiation of the excitation light LR. That is, the light L0 may include the EUV light LE. The EUV light LE is generated from the plasma 127 generated by irradiating the target material 112 with the excitation light LR. The EUV light LE generated from the plasma 127 generated by the target material 112 is emitted to an optical apparatus such as an inspection apparatus as illumination light. Thus, the illumination light includes the EUV light generated from the plasma 127.

The sensor 140 may include various sensors such as a temperature sensor and a stress sensor besides the position sensor 141. The position sensor 141 measures and acquires a surface position of the target material 112. Specifically, the position sensor 141 may include, for example, a displacement meter, a high-speed camera, a low-speed camera, a quadripartite PD (Photo Diode), and a TDI (Time Delay Integration) camera. The position sensor 141 may be either a position sensor that one-dimensionally measures the surface position, a position sensor that two-dimensionally measures the surface position, or a position sensor that three-dimensionally measures the surface position or may be a combination of several position sensors.

The sensor 140 including the position sensor 141 is connected to the acquiring unit 145 and the control unit 160 in a state of capable of communicating information. The sensor 140 outputs information concerning the acquired surface position of the target material 112 to the acquiring unit 145 and the control unit 160. The acquiring unit 145 is connected to the sensor 140 and the control unit 160 in a state of capable of communicating information. The acquiring unit 145 acquires displacement of the surface position of the target material 112 based on the surface position of the target material 112 acquired by the position sensor 141. The acquiring unit 145 outputs information concerning the acquired displacement of the surface position to the control unit 160.

The position sensor 141 may measure and acquire a surface position of the target material 112 in the irradiation position PS where the excitation light LR irradiates the target material 112. In this case, the acquiring unit 145 acquires displacement of the surface position in the irradiation position PS. However, when the position sensor 141 is disposed in a position facing the irradiation position PS to be able to measure and acquire the surface position in the irradiation position PS, the position sensor 141 is likely to be affected by debris. Since the plasma 127 is generated in the irradiation position PS, the surface position is likely to be not accurately acquired.

Therefore, it is desirable that the position sensor 141 is disposed to face a peripheral position separated from the irradiation position PS. The peripheral position includes a portion other than the irradiation position PS on the inner wall surface 116 of the container 111. For example, the position sensor 141 may be disposed to face the position P1 on the side opposite to the irradiation position PS with respect to the rotation axis R. Accordingly, it is possible to suppress the influence of the debris and improve measurement accuracy of the surface position. Note that, if the influence of the debris can be reduced, the position sensor 141 is not limited to the position P1 and may be disposed to face a peripheral position other than the position P1 and may be disposed in the position facing the irradiation position PS.

As explained above, the position sensor 141 may measure and acquire the surface position in the peripheral position other than the irradiation position PS. In this case, the acquiring unit 145 may acquire, from the surface position in the peripheral position acquired by the position sensor 141, displacement of the surface position in the peripheral position and further predict displacement of the surface position in the irradiation position PS. The acquiring unit 145 may predict displacement of the surface position of the target material 112 considering a tilt with respect to the rotation axis and vibration of the target holding unit 110.

For example, the position sensor 141 acquires a surface position in a position on the near side of the irradiation position PS with respect to the direction of the movement of the target holding unit 110. The acquiring unit 145 acquires such displacement of the surface position in the peripheral position in the position on the near side of the irradiation position PS and predicts displacement of the surface position in the irradiation position PS from the acquired displacement. At this time, the acquiring unit 145 can predict displacement of the surface position in the irradiation position PS at a point in time when the excitation light LR reaches the irradiation position PS (an irradiation point in time) with considering a moving speed (rotating speed) of the target holding unit 110 and the distance between the peripheral position and the irradiation position PS. In this way, the acquiring unit 145 acquires the displacement of the surface position in the irradiation position PS by predicting the displacement of the surface position in the irradiation position PS.

The position sensor 141 may acquire the surface position of the target material 112 as a relative position to the second optical member OP2. The acquiring unit 145 may acquire the displacement of the surface position of the target material 112 as displacement of the relative position to the second optical member OP2. Specifically, the position sensor 141 may measure and acquire the surface position in the irradiation position PS of the target material 112 as the relative position to the second optical member OP2 or may measure and acquire the surface position in the peripheral position as the relative position to the second optical member OP2. Thus, the acquiring unit 145 may acquire the displacement of the surface position in the irradiation position PS of the target material 112 as the displacement of the relative position to the second optical member OP2 and may acquire the displacement of the surface position in the peripheral position as the displacement of the relative position to the second optical member OP2.

The position sensor 141 may acquire the surface position of the target material 112 based on the thickness of the liquid surface of the molten metal from the inner wall surface 116. Thus, the acquiring unit 145 may acquire the displacement of the surface position of the target material 112 based on the thickness of the liquid surface of the molten metal from the inner wall surface 116. Note that, when the target material 112 is solid metal fixed to a cylindrical drum, the position sensor 141 may acquire the surface position of the target material 112 based on a tilt and a vibration amount of the drum besides the thickness of the surface of the solid material from the upper surface (the outermost layer surface) of the drum. The acquiring unit 145 may acquire the displacement of the surface position of the target material 112 based on a tilt and a vibration amount of the drum besides the thickness of the surface of the solid material from the upper surface (the outermost layer surface) of the drum. The position sensor 141 may acquire the surface position of the target material 112 by measuring a distance from the position sensor 141 to the surface position of the target material 112.

The acquiring unit 145 may combine other sensors with the position sensor 141 and acquire the displacement of the surface position in the irradiation position PS. Accordingly, displacement of the surface position due to a temperature change of the members of the light source apparatus 100 and displacement of the surface position due to a stress change can be compensated by the other sensors. Specifically, the acquiring unit 145 may correct the displacement of the surface position of the target material 112 based on a temperature change acquired by the temperature sensor provided in the target holding unit 110. The acquiring unit 145 may correct the displacement of the surface position of the target material 112 based on a stress change acquired by the stress sensor provided in the target holding unit 110. The acquisition of the displacement of the surface position by the acquiring unit 145 may include detecting that displacement of the surface position has occurred at that point in time (that is, acquiring the fact of the displacement) or calculating an amount of the displacement. For example, the acquiring unit 145 may detect that a surface position of the target material 112 at that point in time is displaced from a surface position of the target material 112 at a point in time when the excitation light LR irradiated the target material 112 last time or calculate an amount of the displacement or may detect that the surface position of the target material 112 is displaced from a surface position set as a reference (that is, a reference position of the surface position) or calculate an amount of the displacement. The acquisition of the displacement of the surface position by the acquiring unit 145 may include predicting occurrence of displacement and an amount of the displacement of a surface position at a point in time in future (for example, a point in time when the excitation light LR is irradiated). For example, the acquiring unit 145 may predict that a surface position of the target material 112 at a point in time when the target material 112 will be irradiated with the excitation light LR in future will be displaced from a surface position of the target material 112 at a point in time when the target material 112 was irradiated with the excitation light LR last time or predict an amount of the displacement. The acquiring unit 145 may predict that a surface position of the target material 112 at a point in time when the target material 112 will be irradiated with the excitation light LR in future will be displaced from the reference position of the surface position of the target material 112 or predict an amount of the displacement.

The driving unit 150 includes the driving unit 151, the driving unit 152, and the driving unit 153. Note that the driving unit 150 may further include other driving units. In particular, when any one of the driving unit 151, the driving unit 152, and the driving unit 153 is not specified, the driving unit 151, the driving unit 152, and the driving unit 153 are collectively referred to as driving unit 150. Note that the driving unit 150 may be replaced with at least any one of the driving unit 151, the driving unit 152, and the driving unit 153 as appropriate. Alternatively, at least any one of the driving unit 151, the driving unit 152, and the driving unit 153 may be replaced with the driving unit 150 as appropriate. Driving units 151, driving units 152, and the like can be independently driven.

The driving unit 150 is connected to the control unit 160 in a state of being capable of communicating information. The driving unit 150 receives a control amount for driving the driving unit 150 calculated by the control unit 160. The driving unit 150 causes relative positions of a target optical member and the target holding unit 110 to vary based on the control amount.

The driving unit 150 causes relative positions of an optical member including at least one of the first optical member OP1 and the second optical member OP2 and the target holding unit 110 to vary. The optical member including at least one of the first optical member OP1 and the second optical member OP2 is referred to as target optical member for convenience of explanation. The driving unit 150 causes the relative positions of the target optical member and the target holding unit 110 to vary such that relative positions of the target optical member and the surface position of the target material 112 held by the target holding unit 110 are substantially fixed before and after displacement of the surface position in the target material 112. For example, when displacement from the reference position of the surface position of the target material 112 is acquired (occurrence of displacement or a displacement amount is predicted or detected) by the acquiring unit 145, the driving unit 150 causes the relative positions of the target optical member and the target holding unit 110 to vary such that the relative positions of the target optical member and the surface position of the target material 112 held by the target holding unit 110 are substantially the same as relative positions of the target optical member and the surface position of the target material 112 at the time when the surface position of the target material 112 is in the reference position. The reference position of the surface position of the target material 112 here may be a surface position of the target material 112 at a point in time when the target material 112 was irradiated with the excitation light LR last time or may be a surface position defined in advance when the optical apparatus was installed or activated. The reference position may be a position defined by another method.

The driving unit 150 may cause the relative positions of the target optical member and the target holding unit 110 to vary in a direction including a component of a direction orthogonal to the rotation axis R of the target holding unit 110 or may cause the relative positions to vary in a direction including a component in a direction parallel to the rotation axis R. For example, the driving unit 150 may cause to vary and move a position of the target holding unit 110 in a direction along the rotation axis R. The driving unit 150 may causes the position of the target holding unit 110 to vary in a direction parallel to an optical axis of irradiation of the target material 112 by the excitation light LR. Note that rotating speed around the rotation axis R of the target holding unit 110 may be substantially fixed before and after the driving unit 150 causes the relative positions to vary.

The driving unit 151 causes the position of the stage STG to vary. When the chamber CMB is fixed to the stage STG, the driving unit 151 causes the position of the chamber CMB to vary together with the stage STG. For example, the driving unit 151 causes the position of the stage STG to vary in the X-axis direction, the Y-axis direction, and the Z-axis direction. The driving unit 151 rotationally moves the stage STG around the X axis, around the Y axis, and around the Z axis. The driving unit 151 may include, for example, an actuator. Note that the driving unit 151 is not limited to the actuator if the driving unit 151 can cause the position of the stage STG to vary.

The driving unit 152 causes the position of the first optical member OP1 to vary. For example, the driving unit 152 causes the position of the first optical member OP1 to vary in the X-axis direction, the Y-axis direction, and the Z-axis direction. The driving unit 152 rotationally moves the first optical member OP1 around the X-axis, around the Y-axis, and around the Z-axis.

The driving unit 152 may cause the position of a focusing point of the first optical member OP1 to vary. The driving unit 152 is, for example, an actuator. Note that the driving unit 152 is not limited to the actuator if the driving unit 152 can cause the position of the first optical member OP1 to vary. The driving unit 152 drives the first optical member OP1 to change an irradiation direction of the excitation light LR. For example, when the first optical member OP1 is the mirror 121, the driving unit 152 swings an angle of the mirror 121 with respect to the excitation light LR to perform beam scan. Specifically, the driving unit 152 changes a reflection surface of the mirror 121 such that the excitation light LR scans the surface of the target material 112 in a predetermined direction.

When the mirror 121 is a piezo steering mirror, the driving unit 152 may include a driving mechanism provided in the piezo steering mirror. When the mirror 121 is a Galvano mirror, a polygon mirror, and the like, the driving unit 152 may be a driving mechanism provided in the Galvano mirror, the polygon mirror, and the like.

The plasm 127 is generated in the irradiation position PS where the excitation light LR irradiates the target material 112. The generated plasma 127 is observed as a bright spot. The driving unit 152 causes the optical axis of the mirror 121 to vary such that the position of the focusing point is caused to vary. Accordingly, the driving unit 152 moves the bright spot at high speed to perform beam shaving. Thus, when the optical apparatus is an inspection apparatus, it is possible to improve uniformity and availability on a visual field region detected by a detector of the inspection apparatus.

When the excitation light LR is made obliquely incident on the surface of the target material 112, if the surface position of the target material 112 is displaced, the bright spot moves in a direction having a component orthogonal to the optical axis of the excitation light LR in the visual field region detected by the detector of the inspection apparatus. It is possible to cancel displacement of the bright spot in direction of the component orthogonal to the optical axis of the excitation light LR by causing the reflection surface of the mirror 121 to vary in response to the displacement of the surface position of the target material 112.

Displacement of the position of the surface of the target material 112 in a direction parallel to the optical axis of the excitation light LR causes defocus of the excitation light LR. Therefore, the driving unit 152 moves the position of the condensing lens 122 in the direction parallel to the optical axis of the excitation light LR. Accordingly, the driving unit 152 causes the position of the focusing point of the excitation light LR to vary. As explained above, when the first optical member OP1 includes the condensing lens 122, the driving unit 152 may move the position of the condensing lens 122 in the direction parallel to the optical axis of the excitation light LR for cancelling defocus.

The driving unit 153 causes the position of the second optical member OP2 to vary. For example, the driving unit 153 causes the position of the second optical member OP2 to vary in the X-axis direction, the Y-axis direction, and the Z-axis direction. The driving unit 153 rotationally moves the second optical member OP2 around the X axis, around the Y axis, and around the Z axis.

The driving unit 153 may drive the second optical member OP2 to change an extracting direction of the generated light L0 and/or change a focus position to the target holding unit 110. When the surface position of the target material 112 is displaced, an optical path of the light L0 generated from the target material 112 is displaced. Therefore, when the second optical member OP2 includes the collector mirror 131, the driving unit 153 swings an angle of the collector mirror 131 with respect to the bright spot of the light L0. The driving unit 153 is, for example, an actuator. Note that the driving unit 153 is not limited to the actuator if the driving unit 153 can cause the position of the second optical member OP2 to vary.

The displacement of the surface position of the target material 112 may include surface vibration caused by vibration due to the rotation of the container 111, the drum, and the like propagating to the surface and displacement due to consumption or supply of the target material 112. The supply of the target material 112 includes a return current of the evaporated or scattered target material 112 returning to the container 111 and the drum.

The surface vibration of the displacement of the surface position of the target material 112 is displaced at a high frequency. Thus, the mirror 121 such as the steering mirror that can be driven at a high frequency is suitable for cancelling the displacement or defocus of the bright spot caused by the surface vibration of the target material 112.

On the other hand, the direction of the displacement of the surface position due to consumption and supply of the target material 112 is the same as the direction of the surface vibration explained above. However, such displacement due to consumption and supply of the target material 112 is displacement at a low frequency. Thus, the driving unit 150 drives the target optical member such as the first optical member OP1 at a low frequency. The displacement of the surface position due to consumption and supply of the target material 112 may be larger than the displacement of the surface position due to the surface vibration. In particular, when the supply includes a return current, the displacement of the surface position of the target material 112 is outstandingly larger compared with the displacement of the surface position due to the surface vibration.

Therefore, in the case of the displacement of the surface position due to consumption and supply of the target material 112, it is desirable to cause, by the driving unit 151, the position of the stage STG to vary. The movement of the position of the stage STG by the driving unit 151 can cause larger variation in the relative positions of the target optical member and the target holding unit 110 compared with the movement of the position of the target optical member by the driving units 152 and 153. Since the movement of the position of the stage STG by the driving unit 151 moves the entire chamber CMB, it is possible to suppress optical path deviation of the excitation light LR and the light L0 within a smaller range compared with the movement of the position of the target optical member by the driving units 152 and 153. Further, when the driving unit 151 can cause the position of the stage STG to vary in the direction parallel to the optical axis of the excitation light LR, it is possible to suppress defocus.

The control unit 160 drives the driving unit 150 based on the displacement of the surface position of the target material 112 acquired by the acquiring unit 145. Here, when the displacement of the surface position acquired by the acquiring unit 145 is predicted to be a predetermined threshold or more or the displacement is acquired, the control unit 160 may control to drive the driving unit 150. Therefore, even if the surface position of the target material 112 (for example the thickness of the target material 112 from the inner wall surface 116 and the drum surface) is displaced, when the surface position is not displaced by the predetermined threshold or more, the control unit 160 may limit execution of the control of the driving unit 150 to vary the relative position of the target optical element and the target holding unit 110. Here, the displacement of the predetermined threshold or more of the surface position may mean that the surface position is displaced by the predetermined threshold or more from the reference position.

For example, when the displacement of the surface position of the target material 112 from the reference position is acquired (occurrence of the displacement or a displacement amount is predicted or detected) by the acquiring unit 145, the control unit 160 causes, by the driving unit 150, the relative positions of the target optical member and the target holding unit 110 to vary such that the relative positions of the target optical member and the surface position of the target material 112 held by the target holding unit 110 are substantially the same as the relative positions of the target optical member and the surface position of the target material 112 at the time when the surface position of the target material 112 is in the reference position. The reference position of the surface position of the target material 112 here may be the surface position of the target material 112 at the point in time when the target material 112 was irradiated with the excitation light LR last time or may be the surface position defined in advance when the optical apparatus was installed.

Note that a plurality of predetermined thresholds may be set in advance. For example, the predetermined thresholds may include a first threshold, a second threshold, and a third threshold. For example, the thresholds may be thresholds for driving the driving unit 151 or may be thresholds for driving the driving unit 152. The thresholds may be thresholds for driving at least any one of the driving units 150 or may be thresholds for driving all the driving units 150.

The control unit 160 calculates, based on the displacement of the surface position of the target material 112 acquired by the acquiring unit 145, a control amount for driving the driving unit 150. The control unit 160 drives the driving unit 150 based on the calculated control amount. The control unit 160 drives the driving unit 150 such that the relative positions of the target optical member and the surface position of the target material 112 held by the target holding unit 110 are substantially fixed before and after the displacement of the surface position of the target material 112.

The surface position of the target material 112 may suddenly increase or decrease. The surface position is suddenly displaced, for example, when the target material 112 is supplied to the container 111 as in the return current explained above. A value of such sudden displacement may be set as the predetermined threshold. When displacement of the surface position exceeding the predetermined threshold is acquired by the acquiring unit 145, the control unit 160 drives the driving unit 150 such that the relative positions of the target optical member and the target holding unit 110 vary. For example, when the acquiring unit 145 acquires, because of the return current, displacement of the surface position exceeding the predetermined threshold in a direction of approaching the target optical member, that is, a direction in which the thickness of the target material increases from the container inner wall or the drum surface (for example, a −Y-axis direction in FIG. 1), the control unit 160 drives the driving unit 150 and the like such that the relative positions of the target optical member and the target holding unit 110 vary.

When causing the relative positions of the target optical member and the target holding unit 110 to vary, the control unit 160 drives the driving unit 150 such that the relative positions vary in the direction including the component in the direction orthogonal to the rotation axis R. The control unit 160 drives the driving unit 150 such that the relative positions vary in the direction including the component in the direction parallel to the rotation axis R. The control unit 160 drives the driving unit 150 such that the relative positions vary in the direction parallel to the optical axis of irradiation of the target material 112 by the excitation light LR.

The control unit 160 may control the driving unit 150 based on displacement of the surface position acquired as a state at that point in time. That is, the control unit 160 may control the driving unit 150 based on displacement of the surface position acquired (detected) in real time by the acquiring unit 145. The control unit 160 may control the driving unit 150 based on displacement of the surface position in the irradiation position PS predicted from displacement of the peripheral position. Accordingly, the control unit 160 may perform control (for example, feedforward control) to maintain a plasma generation position in a preferable position. That is, the acquiring unit 145 may acquire (predict) displacement of the surface position in the irradiation position PS from displacement of the surface position in a position on the near side of the irradiation position PS with respect to the direction of the movement of the target holding unit 110. The control unit 160 may control the driving unit 150 based on the acquired displacement of the surface position. Accordingly, the driving unit 150 causes the relative positions of the target optical member and the target holding unit 110 to vary.

When the surface position of the target material 112 is displaced at a predetermined period, the acquiring unit 145 may predict displacement of the surface position at a predetermined point in time based on the period. The control unit 160 may control the driving unit 150 based on the displacement acquired (predicted) by the acquiring unit 145. Accordingly, the control unit 160 may perform control (for example, feedforward control) to maintain the plasma generation position (the bright spot) in a preferable position. For example, when the displacement of the surface position includes surface vibration that vibrates at a predetermined period, the acquiring unit 145 may calculate a period of the surface vibration and acquire (predict) displacement of the surface position at a predetermined point in time (for example, an irradiation time of the excitation light LR) based on the calculated period. The control unit 160 may control the driving unit 150 based on the acquired displacement.

When causing the relative positions of the target optical member and the target holding unit 110 to vary, the control unit 160 may cause, by the driving unit 151, the position of the target holding unit 110 to vary. For example, the control unit 160 causes, by the driving unit 151, the position of the stage STG to vary. Accordingly, the driving unit 151 causes the position of the target holding unit 110 to vary.

In this embodiment, when the driving unit 151 causes the position of the stage STG to vary, the position of the target optical member also varies together with the target holding unit 110, because the target holding unit 110 and the target optical member are also placed on the stage STG. Therefore, when causing the relative positions of the target optical member and the target holding unit 110 to vary, the control unit 160 causes, by the driving unit 151, the position of the stage STG to vary and allows the driving unit 152 and the driving unit 153 to cause the position of the target optical member to vary after, before, or simultaneously with the variation of the position of the stage STG. Specifically, for example, when displacement of the surface position exceeding the predetermined threshold in a direction of approaching the target optical member (for example, the −Y-axis direction; hereinafter referred to as first direction) is acquired by the acquiring unit 145 because of increasement of the target material 112 because of such as a return current or supplement of the target material 112, the control unit 160 causes, by the driving unit 151, the position of the stage STG to vary in a second direction (a +Y-axis direction) opposite to the first direction. The control unit 160 allows the driving unit 152 and the driving unit 153 to cause the position of the target optical member to vary in the first direction (the −Y-axis direction) after, before, or simultaneously with the variation of the position of the stage STG. Accordingly, it is possible to cancel the displacement of the surface position of the target material 112, in other words it is possible to cancel or reduce the displacement of the bright spot, and substantially fix the relative positions of the target optical member and the surface position of the target material 112 before and after the displacement. Note that the first direction and the second direction are examples and may include a component in the X-axis direction and a component in the Z-axis direction.

When the first optical member OP1 includes the mirror 121, the control unit 160 may control the driving unit 152 to cause the optical axis of the mirror 121 to vary such that the position of the focusing point varies. When the first optical member OP1 includes the condensing lens 122, the control unit 160 may control the driving unit 152 to move the condensing lens 122 in the direction parallel to the optical axis of the excitation light LR and cause the position of the focusing point to vary. Further, when the second optical member OP2 includes the collector mirror 131, the control unit 160 may control the driving unit 153 to cause the optical axis of the collector mirror 131 to vary such that the focus point to the target holding unit 110 varies and/or the optical axis of the generated light L0 varies. The control unit 160 may drive the driving unit 152 and the driving unit 153 such that the light L0 scans the visual field region in the inspection target of the inspection apparatus.

<Light Source Control Method>

Figure 5:
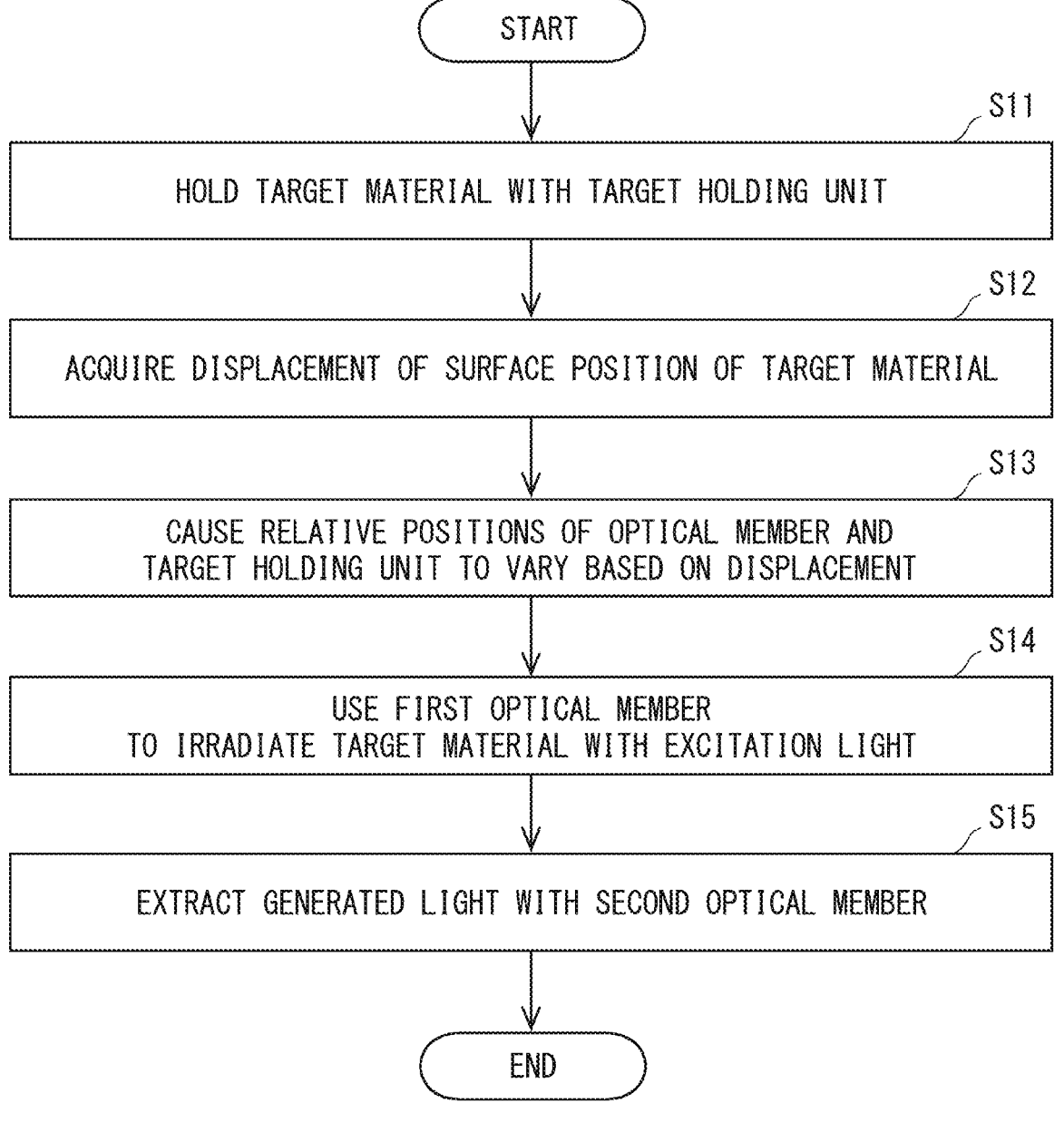
FIG. 5 is a flowchart illustrating a light source control method using the light source apparatus according to the first embodiment.

Subsequently, a light source control method using the light source apparatus 100 is explained. FIG. 5 is a flowchart illustrating a light source control method using the light source apparatus 100 according to the first embodiment. As illustrated in step S11 in FIG. 5, first, the light source apparatus 100 holds the target material 112 with the target holding unit 110. For example, the light source apparatus 100 holds, with the container 111 such as a crucible, the target material 112 such as molten metal that generates the plasma 127 with irradiation of the excitation light LR.

Subsequently, as illustrated in step S12, the light source apparatus 100 acquires displacement of the surface position of the target material 112 with the acquiring unit 145. For example, the acquiring unit 145 may acquire displacement of the surface position from a surface position in a peripheral position acquired by the position sensor 141 and predict displacement of the surface position in the irradiation position PS. Accordingly, the acquiring unit 145 acquires the displacement of the surface position in the irradiation position PS.

Subsequently, as illustrated in step S13, the light source apparatus 100 causes, by the driving unit 150, relative positions of the target optical member including at least one of the first optical member OP1 and the second optical member OP2 and the target holding unit 110 to vary based on the acquired displacement of the surface position. Specifically, the light source apparatus 100 causes the control unit 160 to calculate, based on a displacement amount of the surface position acquired by the acquiring unit 145, a control amount for the driving unit 150 to drive the target optical member and the stage STG. The control unit 160 drives the driving unit 150 with the control amount based on the displacement amount.

The driving unit 150 causes the position of the stage STG and the position of the target optical member to vary such that the relative positions of the target optical member and the surface position of the target material 112 held by the target holding unit 110 are substantially fixed before and after the displacement of the surface position.

Subsequently, as illustrated in step S14, the light source apparatus 100 uses the input optical system 120 including the first optical member OP1 to irradiate the target material 112 with the excitation light LR.

Subsequently, as illustrated in step S15, the light source apparatus 100 extracts, with the output optical system 130 including the second optical member OP2, the light L0 generated by irradiating the target material 112 with the excitation light LR. By controlling the light source apparatus 100 as explained above, it is possible to extract the light L0 used for the optical apparatus.

<Optical Apparatus>

Subsequently, the optical apparatus is explained. The optical apparatus is explained using an inspection apparatus as an example of the optical apparatus.

Figure 6:
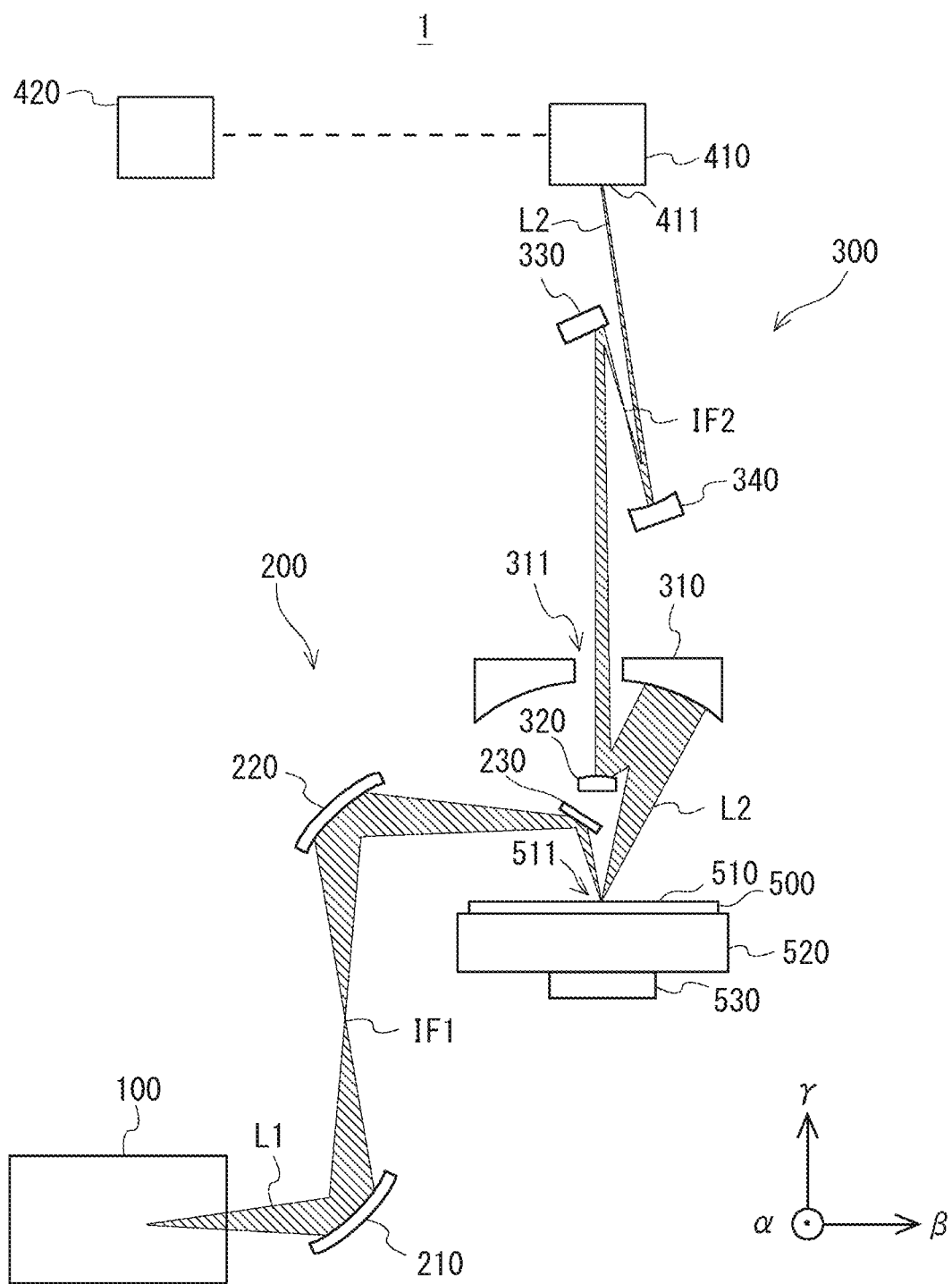
FIG. 6 is a configuration diagram illustrating an inspection apparatus including the light source apparatus according to the first embodiment.

FIG. 6 is a configuration diagram illustrating an inspection apparatus 1 including the light source apparatus 100 according to the first embodiment. As illustrated in FIG. 6, the inspection apparatus 1 includes an illumination optical system 200, an inspection optical system 300, a detector 410, and an image processing unit 420. Note that the inspection apparatus 1 may further include the light source apparatus 100. The inspection apparatus 1 is an apparatus that inspects a defect and the like of a sample 500 using, as the illumination light L1, the light L0 generated by the light source apparatus 100. The sample 500 is, for example, an EUV mask. Note that the sample 500 is not limited to the EUV mask and may be a semiconductor substrate or the like.

The illumination optical system 200 includes an ellipsoidal mirror 210, an ellipsoidal mirror 220, and a drop-in mirror 230. The inspection optical system 300 includes a concave mirror with hole 310, a convex mirror 320, a plane mirror 330, and a concave mirror 340. The concave mirror with hole 310 and the convex mirror 320 configure a Schwarzschild enlarging optical system.

The light source apparatus 100 generates illumination light L1. The illumination light L1 includes, for example, the EUV light LE having a wavelength of 13.5 nm that is the same as an exposure wavelength of the EUV mask to be the sample 500. Note that the illumination light L1 may include light other than the EUV light. The illumination light L1 generated from the light source apparatus 100 is reflected by the ellipsoidal mirror 210. The illumination light L1 reflected by the ellipsoidal mirror 210 travels while being narrowed and is condensed at a convergent point IF1. Thus, the ellipsoidal mirror 210 reflects, as convergent light, the illumination light L1 generated from the light source apparatus 100. The convergent point IF1 is a position conjugate with an upper surface 510 of the sample 500 such as the EUV mask and a detection surface 411 of the detector 410.

After passing the convergent point IF1, the illumination light L1 travels while expanding and is made incident on a reflection mirror such as the ellipsoidal mirror 220. Thus, the illumination light L1 reflected by the ellipsoidal mirror 210 is made incident on the ellipsoidal mirror 220 as divergent light via the convergent point IF1. The illumination light L1 made incident on the ellipsoidal mirror 220 is reflected by the ellipsoidal mirror 220, travels while being narrowed, and is made incident on the drop-in mirror 230. That is, the ellipsoidal mirror 220 reflects the incident illumination light L1 as convergent light. The ellipsoidal mirror 220 makes the illumination light L1 incident on the drop-in mirror 230. The drop-in mirror 230 is disposed right above the EUV mask. The illumination light L1 made incident on the drop-in mirror 230 and reflected is made incident on the sample 500. Thus, the drop-in mirror 230 makes the illumination light L1 incident on the sample 500 by reflecting, to the sample 500, the illumination light L1 reflected by the ellipsoidal mirror 220.

The ellipsoidal mirror 220 condenses the illumination light L1 on the sample 500. The illumination optical system 200 is installed to form an image of the bright spot of the light source apparatus 100 on the upper surface 510 of the sample 500 when the illumination light L1 illuminates the sample 500. Thus, the illumination optical system 200 is critical illumination. As explained above, the illumination optical system 200 illuminates the sample 500 such as the EUV mask using the critical illumination by the illumination light L1 generated by the light source apparatus 100.

The sample 500 is disposed on a stage 520. Here, a plane parallel to the upper surface 510 of the sample 500 is represented as αβ plane and a direction perpendicular to the αβ plane is represented as γ-axis direction. The illumination light L1 is made incident on the sample 500 from a direction tilting from the γ-axis direction. That is, the illumination light L1 is made obliquely incident and illuminates the sample 500.

The stage 520 is a three-dimensional driving stage including a driving unit 530. The driving unit 530 can illuminate a desired region of the sample 500 by moving the stage 520 in the αβ plane. Further, the driving unit 530 can perform focus adjustment by moving the stage 520 in the γ-axis direction.

The illumination light L1 from the light source apparatus 100 illuminates an inspection region of the sample 500. The inspection region illuminated by the illumination light L1 is, for example, a 0.5 mm square. Note that the inspection region is not limited to the 0.5 mm square. The illumination light L1 is made incident on the sample 500 from a direction tilted with respect to the γ-axis direction. Light from the sample 500 illuminated by the illumination light L1 is made incident on the concave mirror with hole 310. In the following explanation, the light from the sample 500 illuminated by the illumination light L1 is explained as reflected light L2. Note that the light made incident on the concave mirror with hole 310 from the sample 500 is not limited to the reflected light L2 and may include diffracted light or the like. The reflected light L2 reflected by the sample 500 is made incident on the concave mirror with hole 310. A hole 311 is provided in the center of the concave mirror with hole 310. The concave mirror with hole 310 condenses the reflected light L2 from the sample 500 and reflects the condensed reflected light L2 as convergent light.

The reflected light L2 reflected by the concave mirror with hole 310 is made incident on the convex mirror 320.

The convex mirror 320 reflects the reflected light L12 reflected by the concave mirror with hole 310 toward the hole 311 of the concave mirror with hole 310. The reflected light L2 having passed through the hole 311 is made incident on the plane mirror 330. The plane mirror 330 makes the reflected light L2 reflected by the convex mirror 320 incident as convergent light through the hole 311 of the concave mirror with hole 310. The reflected light L2 made incident on the plane mirror 330 is reflected by the plane mirror 330. The reflected light L2 reflected by the plane mirror 330 travels while being narrowed and is condensed at a convergent point IF2. Thus, the plane mirror 330 reflects the incident reflected light L2 as convergent light. The convergent point IF2 may be referred to as aperture stop. The convergent point IF2 is a position conjugate with the upper surface 510 of the sample 500 and the detection surface 411 of the detector 410.

After passing the convergent point IF2, the reflected light L2 travels while expanding and is made incident on the concave mirror 340. Thus, the reflected light L2 reflected by the plane mirror 330 as the convergent light is made incident on the concave mirror 340 via the focusing point IF2 as divergent light. The concave mirror 340 reflects the incident reflected light L2 to the detector 410 as convergent light. The reflected light L2 reflected by the concave mirror 340 is detected by the detector 410. As explained above, the inspection optical system 300 inspects the sample 500, which is the inspection target, with the light L1 extracted from the output optical system 130 of the light source apparatus 100. That is, the inspection optical system 300 condenses the reflected light L2 from the sample 500 illuminated by the illumination light L1 and guides the condensed reflected light L2 to the detector 410.

The detector 410 may include a TDI (Time Delay Integration) sensor. The detector 410 receives light from the sample 500 illuminated by the illumination light L1. A region on the sample 500 detected by the detector 410 is referred to as visual field region 511. The detector 410 receives the reflected light L2 from the visual field region 511 illuminated by the illumination light L1. The visual field region 511 may be included in the inspection region illuminated by the illumination light L1. The detector 410 acquires image data of the sample 500 such as the EUV mask. When the detector 410 includes a TDI sensor, the detector 410 includes a plurality of imaging elements linearly disposed side by side in one direction. The imaging elements are, for example, CCDs (Charge Coupled Devices). Note that the imaging elements are not limited to the CCDs.

The image data of the sample 500 acquired by the detector 410 is output to the image processing unit 420 and processed in the image processing unit 420. The image processing unit 420 may be, for example, a server apparatus or an information processing apparatus such as a personal computer.

The reflected light L2 includes information concerning a defect or the like of the sample 500. Regular reflected light of the illumination light L1 made incident on the sample 500 from a direction tilted with respect to the Z-axis direction is detected by the inspection optical system 300. When a defect is present in the sample 500, the defect is observed as a dark image. Such an observation method is referred to as bright field observation. Note that the inspection apparatus 1 may make the illumination light L1 incident on the sample 500 from the Z-axis direction and cause the inspection optical system 300 to detect the illumination light L1. When a defect is present in the sample 500, the defect is observed as a bright image. Such an observation method is referred to as dark field observation.

As explained above, the inspection apparatus 1 in the present embodiment includes the light source apparatus 100 explained above and the inspection optical system 300 that inspects an inspection target with the light L0 extracted from the output optical system 130. An inspection method using the inspection apparatus 1 includes a step of inspecting the inspection target with the light L0 extracted by the light source control method explained above. Note that the inspection apparatus 1 is explained as the optical apparatus. However, the optical apparatus may be an exposure apparatus. For example, the exposure apparatus includes the light source apparatus 100 explained above and an exposure optical system that exposes an exposure target with the light L0 extracted from the output optical system 130. The control unit 160 may drive the driving unit 150 such that the light L0 scans an exposure region in the exposure target. An exposure method using the exposure apparatus includes a step of exposing the exposure target with the light L0 extracted by the light source control method explained above.

Subsequently, effects of the present embodiment are explained. The light source apparatus 100 in the present embodiment drives the driving unit 150 with a control amount based on displacement of the surface position of the target material 112. Accordingly, the light source apparatus 100 causes the relative positions of the target optical member including at least one of the first optical member OP1 and the second optical member OP2 and the target holding unit 110 to vary. Therefore, even if the surface position of the target material 112 is displaced by vibration, supplement, and consumption of the target material 112, the focusing point varies following the displacement. Therefore, it is possible to improve stability of the light L0 extracted from the light source apparatus 100.

When displacement of the surface position exceeding a preset predetermined threshold like relatively large displacement of the surface position due to consumption, supply, and the like of the target material 112 is acquired, the control unit 160 drives the driving unit 150 such that the relative positions of the target optical member and the target holding unit 110 vary. Thus, the target optical member to be driven and the target holding unit 110 are determined in advance according to a degree of the displacement of the surface position. Therefore, it is possible to cause an appropriate position of the member to vary.

The acquiring unit 145 acquires displacement of the surface position in the peripheral position other than the irradiation position PS and predicts displacement of the surface position in the irradiation position PS from the acquired displacement of the surface position in the peripheral position. Specifically, the acquiring unit 145 predicts displacement of the surface position in the irradiation position PS from displacement of the surface position in the position on the near side of the irradiation position PS with respect to the direction of the movement of the target holding unit 110. Thus, the control unit 160 can drive the driving unit 150 based on the predicted displacement of the surface position such that the relative positions of the target optical member and the surface position of the target material 112 held by the target holding unit 110 are substantially fixed before and after the displacement. Accordingly, the focusing point of the excitation light LR can be adjusted to the surface position in the irradiation position PS. Therefore, it is possible to improve stability of the light L1. Further, the control unit 160 may calculate a control amount based on the predicted displacement of the surface position and controls (for example, feedforward-controls) the driving unit 150.

Thus, it is possible to cause the focusing point to vary following the displacement of the surface position.

The target holding unit 110 holds the target material 112 on the inner wall surface 116 with a centrifugal force of the rotating container 111. Thus, it is possible to uniformize the surface position of the target material 112 and improve stability of the light L1.

When causing the relative positions of the target holding unit 110 and the target optical member to vary, the control unit 160 causes, by the driving unit 151, the position of the stage STG to vary and allows the driving units 152 and 153 to cause the position of the target optical member to vary after, before, or simultaneously with the variation of the position of the stage STG. Accordingly, even for relatively large displacement of the surface position due to consumption, supply, and the like of the target material 112, it is possible to substantially fix the relative positions of the target optical member and the surface position of the target material 112 held by the target holding unit 110 before and after the displacement and suppress defocus.

Note, the position sensor 141 may acquire the surface position of the target material 112 as a relative position to a target optical member mentioned hereafter. The acquiring unit 145 may acquire the displacement of the surface position of the target material 112 as displacement of the relative position to the target optical member. Specifically, the position sensor 141 may measure and acquire the surface position in the irradiation position PS of the target material 112 as the relative position to the target optical member or may measure and acquire the surface position in the peripheral position as the relative position to the target optical member. Thus, the acquiring unit 145 may acquire the displacement of the surface position in the irradiation position PS of the target material 112 as the displacement of the relative position to the target optical member and may acquire the displacement of the surface position in the peripheral position as the displacement of the relative position to the target optical member. The position sensor 141 may be attached to the target optical member or attached to the driving unit 150. Therefore, the position of the position sensor may change in conjunction with the driving of the target optical member.

The embodiment of the present disclosure is explained above. However, the present disclosure includes appropriate modifications not spoiling the object and the advantages of the present disclosure and is not limited by the embodiment explained above. In the embodiment of the present disclosure, the target holding unit 110 is the container 111 such as the crucible. However, the target holding unit 110 is not limited to this and may be a target holding unit that holds the target material 112 on the surface of a cylindrical object, a target holding unit that holds the target material 112 with a tape-like object, or the like. The components in the first embodiment may be combined as appropriate.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A light source apparatus comprising:
an input optical system including a first optical member configured to irradiate a target material with excitation light;
an output optical system including a second optical member configured to extract light generated by irradiating the target material with the excitation light;
a target holding unit configured to hold the target material;
an acquiring unit configured to acquire displacement of a surface position of the target material;
a driving unit configured to cause relative positions of an optical member and the target holding unit to vary, the optical member including at least one of the first optical member and the second optical member; and
a control unit configured to drive the driving unit based on the displacement.

2. The light source apparatus according to claim 1, wherein
the acquiring unit acquires a displacement amount of the surface position, and
the control unit drives the driving unit with a control amount based on the displacement amount.

3. The light source apparatus according to claim 1, wherein the control unit drives the driving unit such that relative positions of the optical member and a surface position of the target material held by the target holding unit are substantially fixed before and after the displacement.

4. The light source apparatus according to claim 1, wherein
the acquiring unit acquires the displacement from a reference position of the surface position of the target material, and
the control unit drives the driving unit such that relative positions of the optical member and the surface position of the target material held by the target holding unit at a time of the displacement of the surface position of the target material are substantially the same as relative positions of the optical member and the surface position of the target material held by the target holding unit at a time when the surface position of the target material is present in the reference position.

5. The light source apparatus according to claim 1, wherein, when the displacement of the surface position exceeding a predetermined threshold is acquired by the acquiring unit, the control unit drives the driving unit such that the relative positions of the optical member and the target holding unit vary.

6. The light source apparatus according to claim 5, wherein, when the displacement of the surface position exceeding the predetermined threshold in a direction of approaching the optical member is acquired by the acquiring unit, the control unit drives the driving unit such that the relative positions of the optical member and the target holding unit vary.

7. The light source apparatus according to claim 1, wherein the target holding unit moves the target material to an irradiation position irradiated with the excitation light according to the movement of the target holding unit.

8. The light source apparatus according to claim 7, wherein
the target holding unit rotates around a rotation axis,
the target material moves to the irradiation position according to a rotational movement around the rotation axis of the target holding unit, and
the control unit drives the driving unit such that the relative positions of the optical member and the target holding unit vary in a direction including a component of a direction orthogonal to the rotation axis.

9. The light source apparatus according to claim 8, wherein the control unit drives the driving unit such that the relative positions of the optical member and the target holding unit vary in a direction including a component of a direction parallel to an optical axis of irradiation of the target material with the excitation light.

10. The light source apparatus according to claim 8, wherein rotating speed of the rotation around the rotation axis of the target holding unit is substantially fixed before and after the relative positions vary.

11. The light source apparatus according to claim 7, wherein the target holding unit rotates around a rotation axis, the target material moves to the irradiation position according to rotational movement around the rotation axis of the target holding unit, and the control unit drives the driving unit such that relative positions of the optical member and the target holding unit vary in a direction including a component of a direction parallel to the rotation axis.

12. The light source apparatus according to claim 1, wherein the target material includes molten metal, and the target holding unit includes a container, which holds the target material on an inside, and holds the target material on an inner wall surface of the container with a centrifugal force.

13. The light source apparatus according to claim 12, further comprising a position sensor configured to acquire the surface position of the target material based on a distance to a liquid surface of the molten metal, wherein the acquiring unit acquires the displacement of the surface position from the surface position acquired by the position sensor.

14. The light source apparatus according to claim 7, wherein the acquiring unit predicts the displacement of the surface position in the irradiation position from the displacement of the surface position in a position on a near side of the irradiation position with respect to a direction of the movement of the target holding unit to thereby acquire the displacement of the surface position in the irradiation position, and the control unit controls the driving unit based on the predicted displacement of the surface position.

15. The light source apparatus according to claim 1, wherein, when the surface position is displaced at a predetermined period, the control unit controls the driving unit based on the period.

16. The light source apparatus according to claim 1, wherein the control unit causes, by the driving unit, a position of the target holding unit to vary such that the relative positions of the optical member and the target holding unit vary.

17. The light source apparatus according to claim 1, further comprising a stage on which the target holding unit and the optical member are placed, wherein when causing the relative positions of the target holding unit and the optical member to vary, the control unit causes, by the driving unit, a position of the stage to vary and allows the driving unit to cause a position of the optical member to vary.

18. The light source apparatus according to claim 1, wherein the second optical member includes a collector mirror configured to reflect the generated light.

19. The light source apparatus according to claim 1, wherein the first optical member includes a condensing lens configured to condense the excitation light.

20. The light source apparatus according to claim 1, wherein the light includes EUV light.

21. An inspection apparatus comprising:

the light source apparatus according to claim 1; and an inspection optical system configured to inspect an inspection target with the light extracted from the output optical system.

22. An exposure apparatus comprising:

the light source apparatus according to claim 1; and an exposure optical system configured to expose an exposure target with the light extracted from the output optical system.

23. A light source control method comprising:

a step of holding a target material with a target holding unit;

a step of acquiring displacement of a surface position of the target material with an acquiring unit;

a step of causing, by a driving unit, relative positions of an optical member and the target holding unit to vary, based on the displacement, the optical member including at least one of a first optical member and a second optical member;

a step of using an input optical system including the first optical member to irradiate the target material with excitation light; and a step of extracting, with an output optical system including the second optical member, light generated by irradiating the target material with the excitation light.

24. An inspection method comprising a step of inspecting an inspection target with the light extracted by the light source control method according to claim 23.

25. An exposure method comprising a step of exposing an exposure target with the light extracted by the light source control method according to claim 23.

\* \* \* \* \*